United States Patent
Chen et al.

(10) Patent No.: US 11,870,445 B2
(45) Date of Patent: Jan. 9, 2024

(54) RADIO FREQUENCY DEVICE AND VOLTAGE GENERATION AND HARMONIC SUPPRESSOR THEREOF

(71) Applicant: RichWave Technology Corp., Taipei (TW)

(72) Inventors: Chih-Sheng Chen, Taipei (TW); Yu-Hsiang Chu, Taipei (TW)

(73) Assignee: RichWave Technology Corp., Taipei (TW)

( * ) Notice: Subject to any disclaimer, the term of this patent is extended or adjusted under 35 U.S.C. 154(b) by 157 days.

(21) Appl. No.: 17/411,068

(22) Filed: Aug. 25, 2021

(65) Prior Publication Data

US 2022/0209757 A1 Jun. 30, 2022

(30) Foreign Application Priority Data

Dec. 25, 2020 (TW) ................................. 109146187

(51) Int. Cl.
*H03K 5/1252* (2006.01)
*G05F 1/56* (2006.01)

(52) U.S. Cl.
CPC ............ *H03K 5/1252* (2013.01); *G05F 1/56* (2013.01)

(58) Field of Classification Search
CPC . G05F 1/56; G05F 1/575; G05F 1/565; G05F 1/46; G05F 1/461; G05F 1/467; G05F 3/08; G05F 3/185; G05F 3/20; H03K 5/1252; H02J 1/02; H02J 3/01; H02J 13/0006
See application file for complete search history.

(56) References Cited

U.S. PATENT DOCUMENTS

| | | | |
|---|---|---|---|
| 3,942,039 | A | 3/1976 | Kikuchi et al. |
| 5,717,356 | A | 2/1998 | Kohama |
| 5,818,099 | A | 10/1998 | Burghartz |
| 7,173,471 | B2 | 2/2007 | Nakatsuka et al. |
| 7,460,852 | B2 | 12/2008 | Burgener et al. |
| 7,796,969 | B2 | 9/2010 | Kelly et al. |
| 8,093,940 | B2 | 1/2012 | Huang et al. |

(Continued)

FOREIGN PATENT DOCUMENTS

| | | |
|---|---|---|
| CN | 1354910 | 6/2002 |
| CN | 1574631 | 2/2005 |

(Continued)

OTHER PUBLICATIONS

"Office Action of Taiwan Counterpart Application", dated Dec. 14, 2021, p. 1-p. 4.

*Primary Examiner* — Thienvu V Tran
*Assistant Examiner* — Shahzeb K Ahmad
(74) *Attorney, Agent, or Firm* — JCIPRNET

(57) ABSTRACT

A radio frequency (RF) device and a voltage generation and harmonic suppressor thereof are provided. The RF device includes the voltage generation and harmonic suppressor and a RF circuit. The voltage generation and harmonic suppressor is configured to receive a RF signal to output at least one direct current (DC) voltage related to the RF signal, and configured to suppress a harmonic generated by the RF signal in the voltage generation and harmonic suppressor. The RF circuit is configured to receive the RF signal, and configured to perform an operation according to the at least one DC voltage.

19 Claims, 8 Drawing Sheets

(56) References Cited

U.S. PATENT DOCUMENTS

| | | | |
|---|---|---|---|
| 9,231,578 B2 | 1/2016 | Chih-Sheng | |
| 9,543,929 B2 | 1/2017 | Chen | |
| 2004/0229577 A1 | 11/2004 | Struble | |
| 2005/0162145 A1* | 7/2005 | Smith | H04B 5/0062 327/536 |
| 2006/0001473 A1 | 1/2006 | Yasuda et al. | |
| 2007/0273454 A1* | 11/2007 | Pepper | H03B 19/05 333/132 |
| 2009/0280759 A1 | 11/2009 | Lo et al. | |
| 2011/0254614 A1* | 10/2011 | Huang | H03K 17/063 327/534 |
| 2015/0105032 A1 | 4/2015 | Wang et al. | |
| 2017/0331504 A1* | 11/2017 | Pullela | H04B 1/1018 |
| 2018/0061984 A1 | 3/2018 | Achiriloaie et al. | |
| 2018/0175851 A1 | 6/2018 | Kerr et al. | |
| 2018/0294718 A1* | 10/2018 | Chen | H02M 3/156 |
| 2019/0356283 A1* | 11/2019 | Chen | H03F 3/19 |
| 2020/0091608 A1 | 3/2020 | Alpman et al. | |
| 2023/0145751 A1* | 5/2023 | Lee | G05F 1/56 323/273 |

FOREIGN PATENT DOCUMENTS

| | | |
|---|---|---|
| CN | 1716777 | 1/2006 |
| CN | 102270982 | 12/2011 |
| CN | 103219979 | 7/2013 |
| CN | 106788369 | 5/2017 |
| CN | 105429656 | 11/2018 |
| EP | 0720292 | 7/1996 |
| EP | 1487103 | 12/2004 |
| JP | 2000223902 | 8/2000 |
| JP | 2001068984 | 3/2001 |
| JP | 2005006143 | 1/2005 |
| JP | 2006050583 | 2/2006 |
| TW | 200402200 | 2/2004 |
| TW | 200744315 | 12/2007 |
| TW | 200947902 | 11/2009 |
| TW | 201330500 | 7/2013 |
| WO | 03079566 | 9/2003 |
| WO | 2007136050 | 11/2007 |
| WO | 2012070162 | 5/2012 |

* cited by examiner

RADIO FREQUENCY DEVICE AND VOLTAGE GENERATION AND HARMONIC SUPPRESSOR THEREOF

CROSS-REFERENCE TO RELATED APPLICATION

This application claims the priority benefit of Taiwan application serial no. 109146187, filed on Dec. 25, 2020. The entirety of the above-mentioned patent application is hereby incorporated by reference herein and made a part of this specification.

BACKGROUND

Technical Field

The disclosure relates to a radio frequency (RF) device and a voltage generation and harmonic suppressor thereof, and particularly relates to a RF device and a voltage generation and harmonic suppressor thereof, which are capable of not only outputting a direct current (DC) voltage but also suppressing harmonics.

Description of Related Art

A RF device is usually additionally equipped with a positive voltage generator and a negative voltage generator to provide a positive voltage and a negative voltage for use by a RF circuit in the RF device. However, the conventional positive voltage generator and negative voltage generator are only used to provide positive voltage and negative voltage at fixed levels. Consequently, the RF circuit cannot have better performance. In addition, when designing the RF device, it is necessary to consider whether the electrical characteristics of electronic components will affect the RF signal, so as to prevent influencing the performance of the RF circuit.

SUMMARY

An embodiment of the disclosure provides a radio frequency (RF) device. The RF device includes a voltage generation and harmonic suppressor and a RF circuit. The voltage generation and harmonic suppressor is configured to receive a RF signal to output at least one direct current (DC) voltage related to the RF signal, and configured to suppress a harmonic generated by the RF signal in the voltage generation and harmonic suppressor. The RF circuit is configured to receive the RF signal, and configured to perform an operation according to the at least one DC voltage.

An embodiment of the disclosure provides a voltage generation and harmonic suppressor. The voltage generation and harmonic suppressor includes a first voltage generation and harmonic suppression circuit and a second voltage generation and harmonic suppression circuit. The first voltage generation and harmonic suppression circuit is configured to receive a RF signal, and configured to suppress a first even harmonic generated by the RF signal in the first voltage generation and harmonic suppression circuit. The second voltage generation and harmonic suppression circuit is configured to receive the RF signal, and configured to suppress a first odd harmonic generated by the RF signal in the first voltage generation and harmonic suppression circuit. At least one of the first voltage generation and harmonic suppression circuit and the second voltage generation and harmonic suppression circuit is configured to output at least one DC voltage related to the RF signal.

In order to make the above and other features of the disclosure more comprehensible, several exemplary embodiments are described in detail hereinafter with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
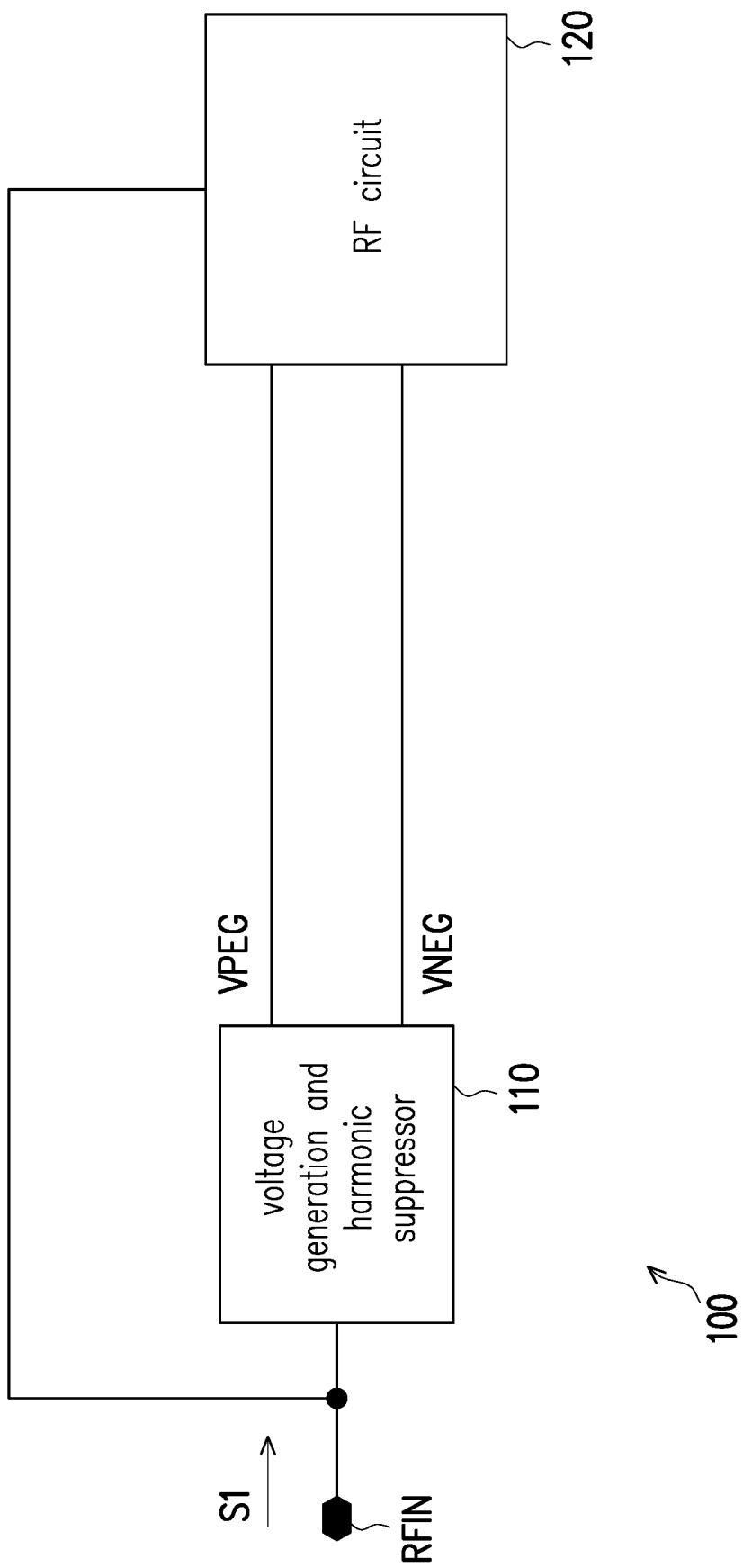
FIG. 1 is a schematic circuit block diagram of a RF device according to an embodiment of the disclosure.

The term "couple (or connect)" used throughout this specification (including the claims) can refer to any direct or indirect connection means. For example, if it is described that a first device is coupled (or connected) to a second device, it should be interpreted that the first device may be directly connected to the second device, or the first device may be indirectly connected to the second device through other devices or some connection means. The terms such as "first" and "second" mentioned throughout this specification (including the claims) are used to name the elements or distinguish different embodiments or ranges, not to restrict the upper or lower limit of the number of elements or restrict the order of elements. In addition, wherever possible, elements/components/steps with the same reference numerals in the drawings and embodiments represent the same or similar parts. Elements/components/steps with the same reference numerals or the same names in different embodiments may be reference for each other.

FIG. 1 is a schematic circuit block diagram of a radio frequency (RF) device 100 according to an embodiment of the disclosure. The RF device 100 includes a voltage generation and harmonic suppressor 110 and a RF circuit 120.

An input terminal of the voltage generation and harmonic suppressor 110 is coupled to a common terminal RFIN and is configured for receiving a RF signal S1. The RF signal S1 may come from an antenna. At least one output terminal of the voltage generation and harmonic suppressor 110 is configured to output at least one direct current (DC) voltage VPEG and/or VNEG related to the RF signal S1. Furthermore, the voltage generation and harmonic suppressor 110 may generate the at least one DC voltage VPEG and/or VNEG according to the RF signal S1, and the level of the at least one DC voltage VPEG and/or VNEG may vary with the power of the RF signal S1. The DC voltage VPEG may be greater than the DC voltage VNEG. For example, the DC voltage VPEG may be a positive voltage, and the DC voltage VNEG may be a negative voltage. In the embodiment shown in FIG. 1, the at least one output terminal of the voltage generation and harmonic suppressor 110 includes a first output terminal and a second output terminal. The first output terminal is configured to output the DC voltage VPEG, and the second output terminal is configured to output the DC voltage VNEG. In some embodiments, the voltage generation and harmonic suppressor 110 may be configured to output one of the DC voltages VNEG and VPEG, and the number of the output terminals of the voltage generation and harmonic suppressor 110 may be set correspondingly. In addition, the disclosure may appropriately design the voltage generation and harmonic suppressor 110, so as to suppress the harmonic generated by the RF signal S1 in the voltage generation and harmonic suppressor 110.

The RF circuit 120 is coupled to the common terminal RFIN and is configured for receiving the RF signal S1. The RF circuit 120 may also be configured to transmit the RF signal S1. According to design requirements, the RF circuit 120 may include a RF switch, a low noise amplifier (LNA), a power amplifier, or other RF elements. The RF circuit 120 is also coupled to the voltage generation and harmonic suppressor 110 and is configured to receive the at least one DC voltage VPEG and/or VNEG, and to perform an operation according to the at least one DC voltage VPEG and/or VNEG.

In this embodiment, the RF circuit 120 includes the RF switch, and the operation that the RF circuit 120 performs according to the at least one DC voltage VPEG and/or VNEG includes performing an off operation on the RF switch, for example. The RF switch may include an N-metal oxide semiconductor (NMOS) transistor having a triple-well structure, or a P-metal oxide semiconductor (PMOS) transistor having a triple-well structure. The DC voltage VPEG may be applied to a deep N-well of the NMOS transistor, and the DC voltage VNEG may be applied to a P-well of the NMOS transistor, so as to set the NMOS transistor to an off state; alternatively, the DC voltage VPEG may be applied to a N-well of the PMOS transistor, and the DC voltage VNEG may be applied to a deep P-well of the PMOS transistor, so as to set the PMOS transistor to an off state. In this way, when the power of the RF signal S1 increases, the levels of the DC voltages VNEG and VPEG increase accordingly. Because the P-well and the deep N-well of the NMOS transistor may form a PN junction, or the deep P-well and the N-well of the PMOS transistor may form a PN junction, the DC voltages VNEG and VPEG are equivalent to applying a reverse bias voltage to the PN junction, which may increase a threshold voltage of the NMOS transistor or a threshold voltage of the PMOS transistor and help to reduce unexpected turn-on of the NMOS transistor or PMOS transistor. In the case where the RF switch is a single-pole single-throw (SPST) switch, for example, when the NMOS transistor or PMOS transistor on a series path is in an on state for transmitting the RF signal S1, the NMOS transistor or PMOS transistor on a shunt path is in the off state. That is, the DC voltages VPEG and VNEG may be applied to the NMOS transistor or PMOS transistor on the shunt path to increase the threshold voltage of the NMOS transistor or the threshold voltage of the PMOS transistor. Accordingly, the RF signal S1 does not easily leak to the shunt path and consequently does not easily derive a non-linear component.

Figure 2:
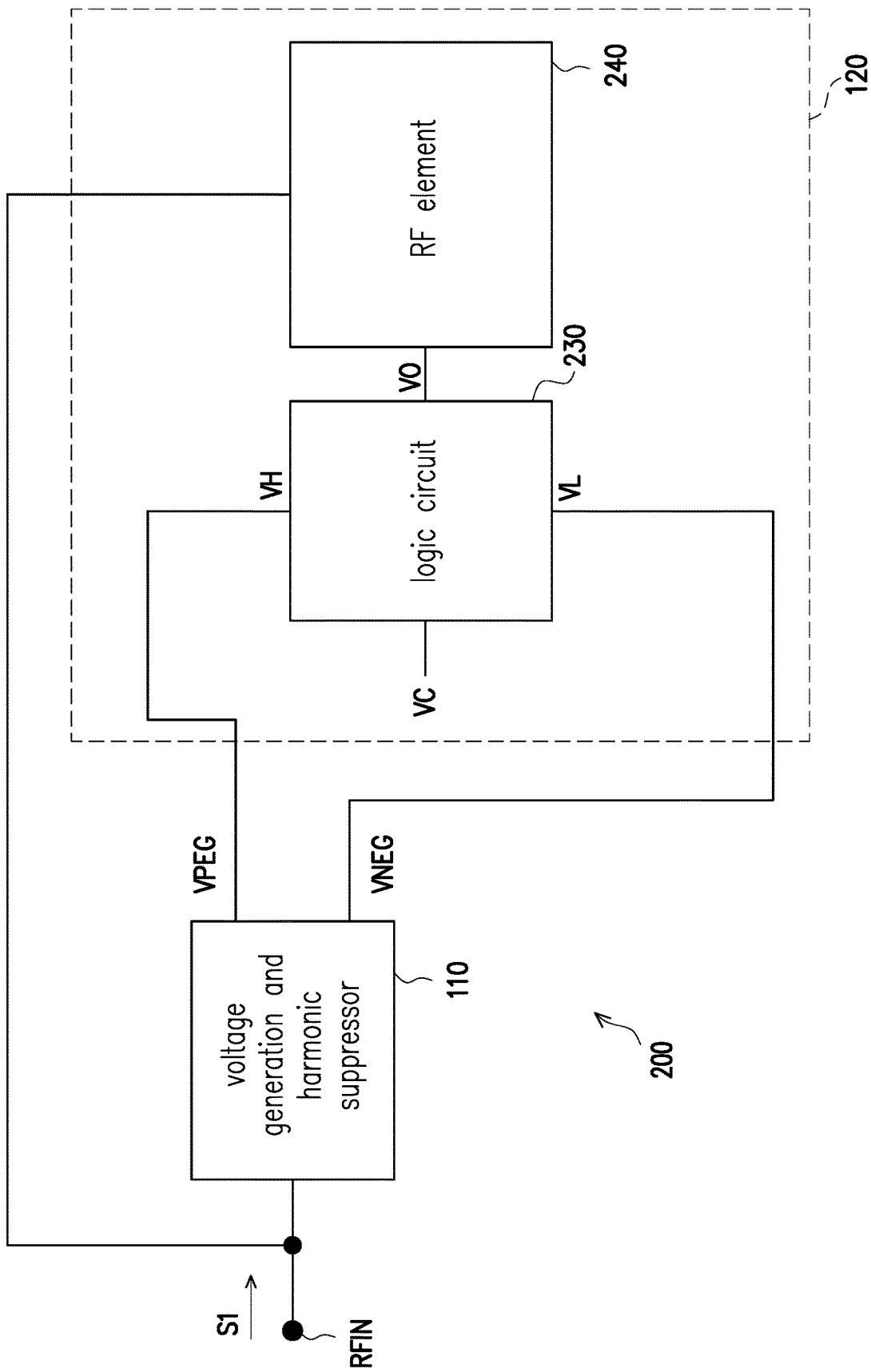
FIG. 2 is a schematic circuit diagram of a RF device according to another embodiment of the disclosure.

FIG. 2 is a schematic circuit diagram of a RF device 200 according to another embodiment of the disclosure. The RF circuit 120 of FIG. 2 includes a logic circuit 230 and a RF element 240.

The operation that the RF circuit 120 performs according to the at least one DC voltage VPEG and/or VNEG includes performing a power supply operation on the logic circuit 230. A high-level power supply voltage VH of the logic circuit 230 is related to the DC voltage VPEG and/or a low-level power supply voltage VL of the logic circuit 230 is related to the DC voltage VNEG, so as to supply power to the logic circuit 230. In the embodiment shown in FIG. 2, a first terminal of the logic circuit 230 is configured to receive the DC voltage VPEG, and the DC voltage VPEG is the high-level power supply voltage VH of the logic circuit 230. A second terminal of the logic circuit 230 is configured to receive the DC voltage VNEG, and the DC voltage VNEG is the low-level power supply voltage VL of the logic circuit 230. In this way, the DC voltages VPEG and VNEG may be used to supply power to the logic circuit 230. In some embodiments, according to design requirements, the logic circuit 230 may receive one of the DC voltages VPEG and VNEG. In addition, an input terminal of the logic circuit 230 is configured to receive a control signal VC, and an output terminal of the logic circuit 230 is configured to output an output signal VO.

The logic circuit 230 may include an inverter. For example, when the voltage level of the control signal VC received by the logic circuit 230 is close to or equal to the level of the high-level power supply voltage VH, the voltage level of the output signal VO output by the logic circuit 230 is pulled down to be close to or equal to the level of the low-level power supply voltage VL. Conversely, when the voltage level of the control signal VC received by the logic circuit 230 is close to or equal to the level of the low-level power supply voltage VL, the voltage level of the output signal VO output by the logic circuit 230 is pulled up to be close to or equal to the level of the high-level power supply voltage VH. Since the levels of the DC voltages VPEG and VNEG may vary with the power of the RF signal S1, the levels of the high-level power supply voltage VH and the low-level power supply voltage VL may also vary with the power of the RF signal S1, so that the voltage level of the output signal VO has a wider operating range (that is, the high voltage level of the output signal VO can be pulled up to be close to or equal to the level of the high-level power supply voltage VH, or the low voltage level of the output signal VO can be pulled down to be close to or equal to the level of the low-level power supply voltage VL).

The RF element 240 is coupled to the output terminal of the logic circuit 230 and is configured for receiving the output signal VO. The output signal VO may be configured to control the RF element 240. In this embodiment, the RF circuit 120 includes a RF switch, and the RF element 240 includes an NMOS transistor, for example. The output signal VO may be provided to the control terminal (such as the gate) of the NMOS transistor to control the conduction state of the NMOS transistor. Furthermore, when the voltage level of the output signal VO is close to or equal to the level of the high-level power supply voltage VH, it helps to completely turn on the NMOS transistor, so that the NMOS transistor has a lower on-resistance, thereby reducing the insertion loss of the NMOS transistor. Conversely, when the voltage level of the output signal VO is close to or equal to the level of the low-level power supply voltage VL, it helps to completely turn off the NMOS transistor, thereby improving the isolation capability of the RF switch. In an embodiment, the logic circuit 230 may include two inverters, and the output signals VO output by the two inverters may be mutually inverted. Further, in the case where the RF switch is a SPST switch, for example, one of the two inverters may be configured to control the NMOS transistor on the series path, and the other of the two inverters may be configured to control the NMOS transistor on the shunt path.

Figure 3:
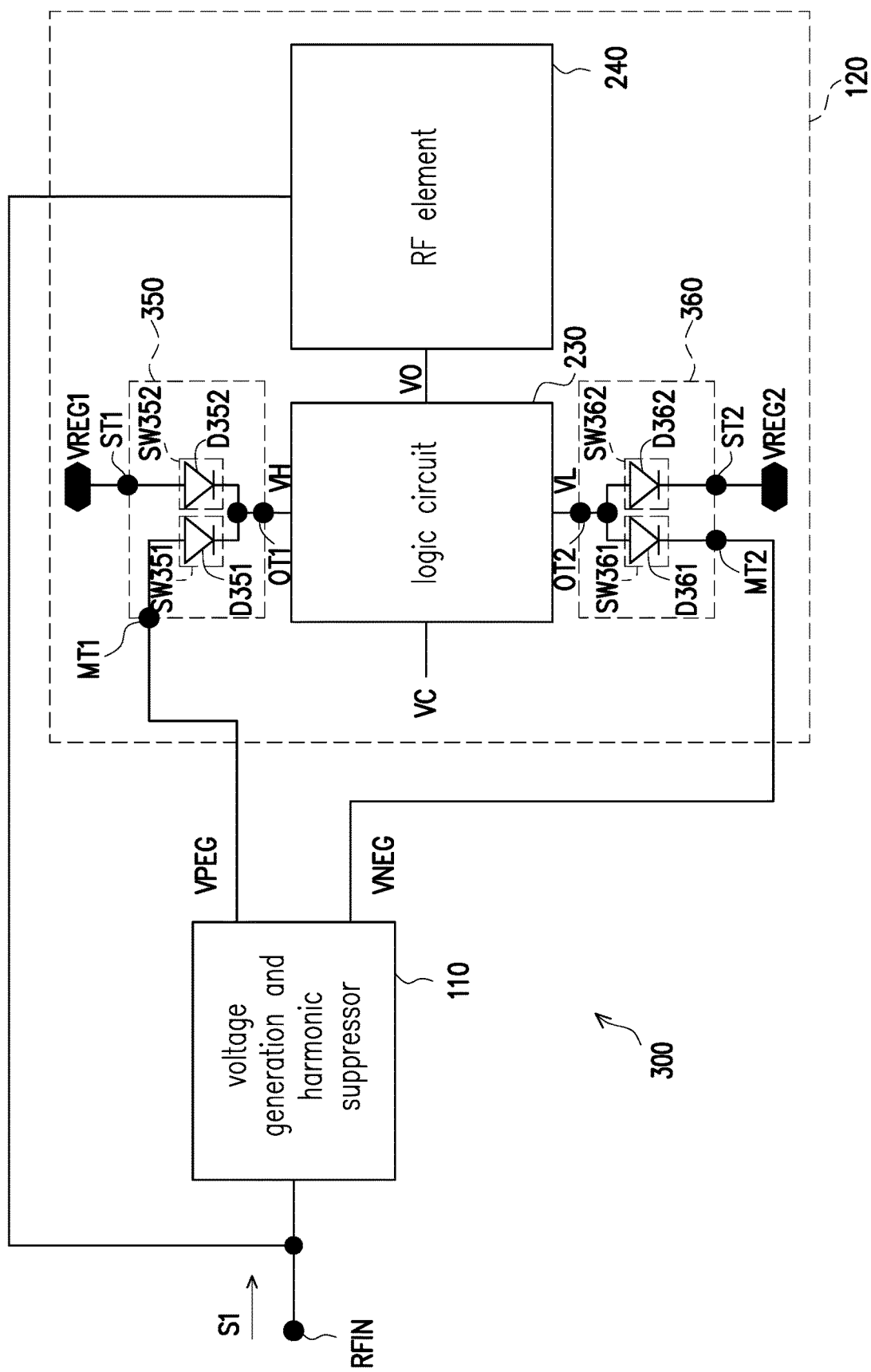
FIG. 3 is a schematic circuit diagram of a RF device according to yet another embodiment of the disclosure.

FIG. 3 is a schematic circuit diagram of a RF device 300 according to yet another embodiment of the disclosure. Compared with the RF device 200 of FIG. 2, the RF circuit 120 of FIG. 3 further includes voltage selection circuits 350 and 360.

A main voltage receiving terminal MT1 of the voltage selection circuit 350 is coupled to the first output terminal of the voltage generation and harmonic suppressor 110 and is configured for receiving the DC voltage VPEG. A secondary voltage receiving terminal ST1 of the voltage selection circuit 350 is coupled to the voltage regulation circuit (not shown in FIG. 3) and is configured for receiving a base voltage VREG1. An output terminal OT1 of the voltage selection circuit 350 is coupled to the first terminal of the logic circuit 230 for outputting the high-level power supply voltage VH and providing it to the logic circuit 230. The base voltage VREG1 may be a fixed voltage (for example, a positive voltage at a fixed level) that is independent of voltage variations of the DC voltage VPEG, and the level of the base voltage VREG1 may be determined according to design requirements. The voltage selection circuit 350 may be configured to generate the high-level power supply voltage VH according to the DC voltage VPEG and the base voltage VREG1. For example, the voltage selection circuit 350 may select the higher one of the DC voltage VPEG and the base voltage VREG1 to generate the high-level power supply voltage VH for supplying power to the logic circuit 230.

The voltage selection circuit 350 includes switch circuits SW351 and SW352. A first terminal of the switch circuit SW351 is coupled to the main voltage receiving terminal MT1 of the voltage selection circuit 350, and a second terminal is coupled to the output terminal OT1 of the voltage selection circuit 350. A first terminal of the switch circuit SW352 is coupled to the secondary voltage receiving terminal ST1 of the voltage selection circuit 350, and a second terminal is coupled to the second terminal of the switch circuit SW351. When the DC voltage VPEG is not ready (that is, the RF signal S1 does not exist, or the power of the RF signal S1 is small), the level of the DC voltage VPEG is lower than the level of the base voltage VREG1, the switch circuit SW351 may be in an off state, and the switch circuit SW352 may be in an on state. Therefore, the voltage selection circuit 350 may select the base voltage VREG1 to generate the high-level power supply voltage VH. When the DC voltage VPEG is ready (that is, the power of the RF signal S1 is large enough), the level of the DC voltage VPEG is higher than the level of the base voltage VREG1, the switch circuit SW351 may be in an on state, and the switch circuit SW352 may be in an off state. Therefore, the voltage selection circuit 350 may select the DC voltage VPEG to generate the high-level power supply voltage VH, so that the level of the high-level power supply voltage VH may vary with the level of the DC voltage VPEG. In this way, the voltage level of the output signal VO is no longer limited by the level of the base voltage VREG1 and can be pulled up to be close to or equal to the level of the high-level power supply voltage VH to have a wider operating range, so that the RF element 240 has better performance.

A main voltage receiving terminal MT2 of the voltage selection circuit 360 is coupled to the second output terminal of the voltage generation and harmonic suppressor 110 and is configured for receiving the DC voltage VNEG. A secondary voltage receiving terminal ST2 of the voltage selection circuit 360 is coupled to the voltage regulation circuit (not shown in FIG. 3) and is configured for receiving a base voltage VREG2. An output terminal OT2 of the voltage selection circuit 360 is coupled to the second terminal of the logic circuit 230 for outputting the low-level power supply voltage VL and providing it to the logic circuit 230. The base voltage VREG2 may be a fixed voltage (for example, a negative voltage at a fixed level or a 0 volt voltage) that is independent of voltage variations of the DC voltage VNEG, and the level of the base voltage VREG2 may be determined according to design requirements. The voltage selection circuit 360 may be configured to generate the low-level power supply voltage VL according to the DC voltage VNEG and the base voltage VREG2. For example, the voltage selection circuit 360 may select the lower one of the DC voltage VNEG and the base voltage VREG2 to generate the low-level power supply voltage VL for supplying power to the logic circuit 230.

The voltage selection circuit 360 includes switch circuits SW361 and SW362. A first terminal of the switch circuit SW361 is coupled to the output terminal OT2 of the voltage selection circuit 360, and a second terminal is coupled to the main voltage receiving terminal MT2 of the voltage selection circuit 360. A first terminal of the switch circuit SW362 is coupled to the first terminal of the switch circuit SW361, and a second terminal is coupled to the secondary voltage receiving terminal ST2 of the voltage selection circuit 360. When the DC voltage VNEG is not ready (that is, the RF signal S1 does not exist, or the power of the RF signal S1 is small), the level of the DC voltage VNEG is higher than the level of the base voltage VREG2, the switch circuit SW361 is in an off state, and the switch circuit SW362 is in an on state. Therefore, the voltage selection circuit 360 may select the base voltage VREG2 to generate the low-level power supply voltage VL. When the DC voltage VNEG is ready (that is, the power of the RF signal S1 is large enough), the level of the DC voltage VNEG is lower than the level of the base voltage VREG2, the switch circuit SW361 is in an on state, and the switch circuit SW362 is in an off state. Therefore, the voltage selection circuit 360 may select the DC voltage VNEG to generate the low-level power supply voltage VL, so that the level of the low-level power supply voltage VL may vary with the level of the DC voltage VNEG. In this way, the voltage level of the output signal VO is no longer limited by the level of the base voltage VREG2 and can be pulled down to be close to or equal to the level of the low-level power supply voltage VL to have a wider operating range, so that the RF element 240 has better performance.

In the embodiment shown in FIG. 3, the switch circuits SW351, SW352, SW361, and SW362 may include diodes D351, D352, D361, and D362, respectively, the first terminals (such as anodes) of the diodes D351 to D362 are coupled to the first terminals of the corresponding switch circuits SW351 to SW362, and the second terminals (such as cathodes) are coupled to the second terminals of the corresponding switch circuits SW351 to SW362. However, the implementation of the switch circuits SW351 to SW362 is not limited to FIG. 3. In some embodiments, diode-connected transistors may be used to replace the diodes D351 to D362 shown in FIG. 3. In other embodiments, the voltage selection circuits 350 and/or 360 may be selectively disposed according to design requirements.

Figure 4:
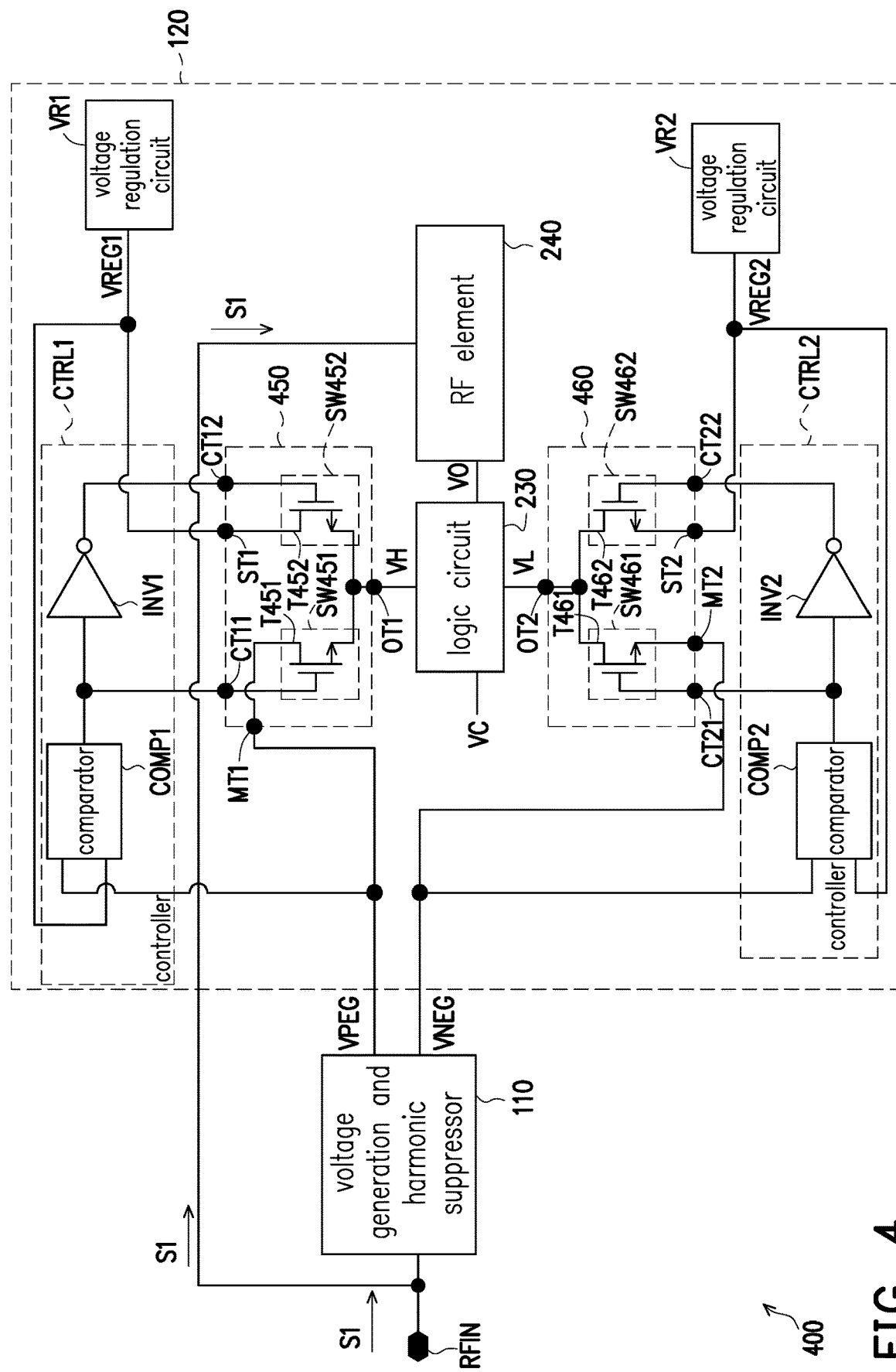
FIG. 4 is a schematic circuit diagram of a RF device according to yet another embodiment of the disclosure.

FIG. 4 is a schematic circuit diagram of a RF device 400 according to yet another embodiment of the disclosure. Compared with the RF device 200 of FIG. 2, the RF circuit 120 of FIG. 4 further includes voltage selection circuits 450 and 460, controllers CTRL1 and CTRL2, and voltage regulation circuits VR1 and VR2. In some embodiments, the voltage regulation circuits VR1 and VR2 may be disposed outside the RF circuit 120. The voltage regulation circuits VR1 and VR2 are configured to output the base voltages VREG1 and VREG2, respectively.

A main voltage receiving terminal MT1 of the voltage selection circuit 450 is coupled to the first output terminal of the voltage generation and harmonic suppressor 110 and is configured for receiving the DC voltage VPEG. A secondary voltage receiving terminal ST1 of the voltage selection circuit 450 is coupled to the voltage regulation circuit VR1 and is configured for receiving the base voltage VREG1. An output terminal OT1 of the voltage selection circuit 450 is coupled to the first terminal of the logic circuit 230 for outputting the high-level power supply voltage VH and providing it to the logic circuit 230. The control terminals CT11 and CT12 of the voltage selection circuit 450 are coupled to the controller CTRL1. The base voltage VREG1 may be a fixed voltage (for example, a positive voltage at a fixed level) that is independent of voltage variations of the DC voltage VPEG, and the level of the base voltage VREG1 may be determined according to design requirements.

The voltage selection circuit 450 includes switch circuits SW451 and SW452. A first terminal of the switch circuit SW451 is coupled to the main voltage receiving terminal MT1 of the voltage selection circuit 450, a second terminal is coupled to the output terminal OT1 of the voltage selection circuit 450, and a control terminal is coupled to the control terminal CT11 of the voltage selection circuit 450. A first terminal of the switch circuit SW452 is coupled to the secondary voltage receiving terminal ST1 of the voltage selection circuit 450, a second terminal is coupled to the second terminal of the switch circuit SW451, and a control terminal is coupled to the control terminal CT12 of the voltage selection circuit 450.

The controller CTRL1 includes a comparator COMP1 and an inverter INV1. A first input terminal of the comparator COMP1 is coupled to the first output terminal of the voltage generation and harmonic suppressor 110 and is configured for receiving the DC voltage VPEG. A second input terminal of the comparator COMP1 is coupled to the voltage regulation circuit VR1 and is configured for receiving the base voltage VREG1. An output terminal of the comparator COMP1 is coupled to the control terminal CT11 of the voltage selection circuit 450. An input terminal of the inverter INV1 is coupled to the output terminal of the comparator COMP1, and an output terminal is coupled to the control terminal CT12 of the voltage selection circuit 450. The controller CTRL1 may control the voltage selection circuit 450 to generate the high-level power supply voltage VH according to the DC voltage VPEG and the base voltage VREG1. For example, the controller CTRL1 may be configured to determine the higher one of the DC voltage VPEG and the base voltage VREG1, so as to control the voltage selection circuit 450 to generate the high-level power supply voltage VH accordingly. That is, the voltage selection circuit 450 may be configured to generate the high-level power supply voltage VH according to the DC voltage VPEG and the base voltage VREG1 for supplying power to the logic circuit 230.

When the DC voltage VPEG is not ready (that is, the RF signal S1 does not exist, or the power of the RF signal S1 is small), the level of the DC voltage VPEG is lower than the level of the base voltage VREG1, the signal output by the comparator COMP1 may set the switch circuit SW451 to an off state, and the signal output by the inverter INV1 may set the switch circuit SW452 to an on state. Therefore, the voltage selection circuit 450 may select the base voltage VREG1 to generate the high-level power supply voltage VH. When the DC voltage VPEG is ready (that is, the power of the RF signal S1 is large enough), the level of the DC voltage VPEG is higher than the level of the base voltage VREG1, the signal output by the comparator COMP1 may set the switch circuit SW451 to an on state, and the signal output by the inverter INV1 may set the switch circuit SW452 to an off state. Therefore, the voltage selection circuit 450 may select the DC voltage VPEG to generate the high-level power supply voltage VH, so that the level of the high-level power supply voltage VH may vary with the level of the DC voltage VPEG. In this way, the voltage level of the output signal VO is no longer limited by the level of the base voltage VREG1 and can be pulled up to be close to or equal to the level of the high-level power supply voltage VH to have a wider operating range, so that the RF element 240 has better performance.

A main voltage receiving terminal MT2 of the voltage selection circuit 460 is coupled to the second output terminal of the voltage generation and harmonic suppressor 110 and is configured for receiving the DC voltage VNEG. A secondary voltage receiving terminal ST2 of the voltage selection circuit 460 is coupled to the voltage regulation circuit VR2 and is configured for receiving the base voltage VREG2. An output terminal OT2 of the voltage selection circuit 460 is coupled to the second terminal of the logic circuit 230 for outputting the low-level power supply voltage VL and providing it to the logic circuit 230. The control terminals CT21 and CT22 of the voltage selection circuit 460 are coupled to the controller CTRL2. The base voltage VREG2 may be a fixed voltage (for example, a negative voltage at a fixed level or a 0 volt voltage) that is independent of voltage variations of the DC voltage VNEG, and the level of the base voltage VREG2 may be determined according to design requirements.

The voltage selection circuit 460 includes switch circuits SW461 and SW462. A first terminal of the switch circuit SW461 is coupled to the output terminal OT2 of the voltage selection circuit 460, a second terminal is coupled to the main voltage receiving terminal MT2 of the voltage selection circuit 460, and a control terminal is coupled to the control terminal CT21 of the voltage selection circuit 460. A first terminal of the switch circuit SW462 is coupled to the first terminal of the switch circuit SW461, a second terminal is coupled to the secondary voltage receiving terminal ST2 of the voltage selection circuit 460, and a control terminal is coupled to the control terminal CT22 of the voltage selection circuit 460.

The controller CTRL2 includes a comparator COMP2 and an inverter INV2. A first input terminal of the comparator COMP2 is coupled to the second output terminal of the voltage generation and harmonic suppressor 110 and is configured for receiving the DC voltage VNEG. A second input terminal of the comparator COMP2 is coupled to the voltage regulation circuit VR2 and is configured for receiving the base voltage VREG2. An output terminal of the comparator COMP2 is coupled to the control terminal CT21 of the voltage selection circuit 460. An input terminal of the inverter INV2 is coupled to the output terminal of the comparator COMP2, and an output terminal is coupled to the control terminal CT22 of the voltage selection circuit 460. The controller CTRL2 may control the voltage selection circuit 460 to generate the low-level power supply voltage VL according to the DC voltage VNEG and the base voltage VREG2. For example, the controller CTRL2 may be configured to determine the lower one of the DC voltage VNEG and the base voltage VREG2, so as to control the voltage selection circuit 460 to generate the low-level power supply voltage VL accordingly. That is, the voltage selection circuit 460 may be configured to generate the low-level power supply voltage VL according to the DC voltage VNEG and the base voltage VREG2 for supplying power to the logic circuit 230.

When the DC voltage VNEG is not ready (that is, the RF signal S1 does not exist, or the power of the RF signal S1 is small), the level of the DC voltage VNEG is higher than the level of the base voltage VREG2, the signal output by the comparator COMP2 may set the switch circuit SW461 to an off state, and the signal output by the inverter INV2 may set the switch circuit SW462 to an on state. Therefore, the voltage selection circuit 460 may select the base voltage VREG2 to generate the low-level power supply voltage VL. When the DC voltage VNEG is ready (that is, the power of the RF signal S1 is large enough), the level of the DC voltage VNEG is lower than the level of the base voltage VREG2, the signal output by the comparator COMP2 may set the switch circuit SW461 to an on state, and the signal output by the inverter INV2 may set the switch circuit SW462 to an off state. Therefore, the voltage selection circuit 460 may select the DC voltage VNEG to generate the low-level power supply voltage VL, so that the level of the low-level power supply voltage VL may vary with the level of the DC voltage VNEG. In this way, the voltage level of the output signal VO is no longer limited by the level of the base voltage VREG2 and can be pulled down to be close to or equal to the level of the low-level power supply voltage VL to have a wider operating range, so that the RF element 240 has better performance.

The switch circuits SW451, SW452, SW461, and SW462 may include transistors T451, T452, T461, and T462, respectively, the first terminals (for example, drains) of the transistors T451 to T462 are coupled to the first terminals of the corresponding switch circuits SW451 to SW462, the second terminals (for example, sources) are coupled to the second terminals of the corresponding switch circuits SW451 to SW462, and the control terminals (for example, gates) are coupled to the control terminals of the corresponding switch circuits SW451 to SW462. In the embodiment shown in FIG. 4, NMOS transistors are used to implement the transistors T451 to T462, but the implementation of the transistors T451 to T462 is not limited to FIG. 4. In some embodiments, the transistors T451 to T462 may be other types of transistors. In other embodiments, the voltage selection circuit 450 and the controller CTRL1 and/or the voltage selection circuit 460 and the controller CTRL2 may be selectively disposed according to design requirements.

Figure 5:
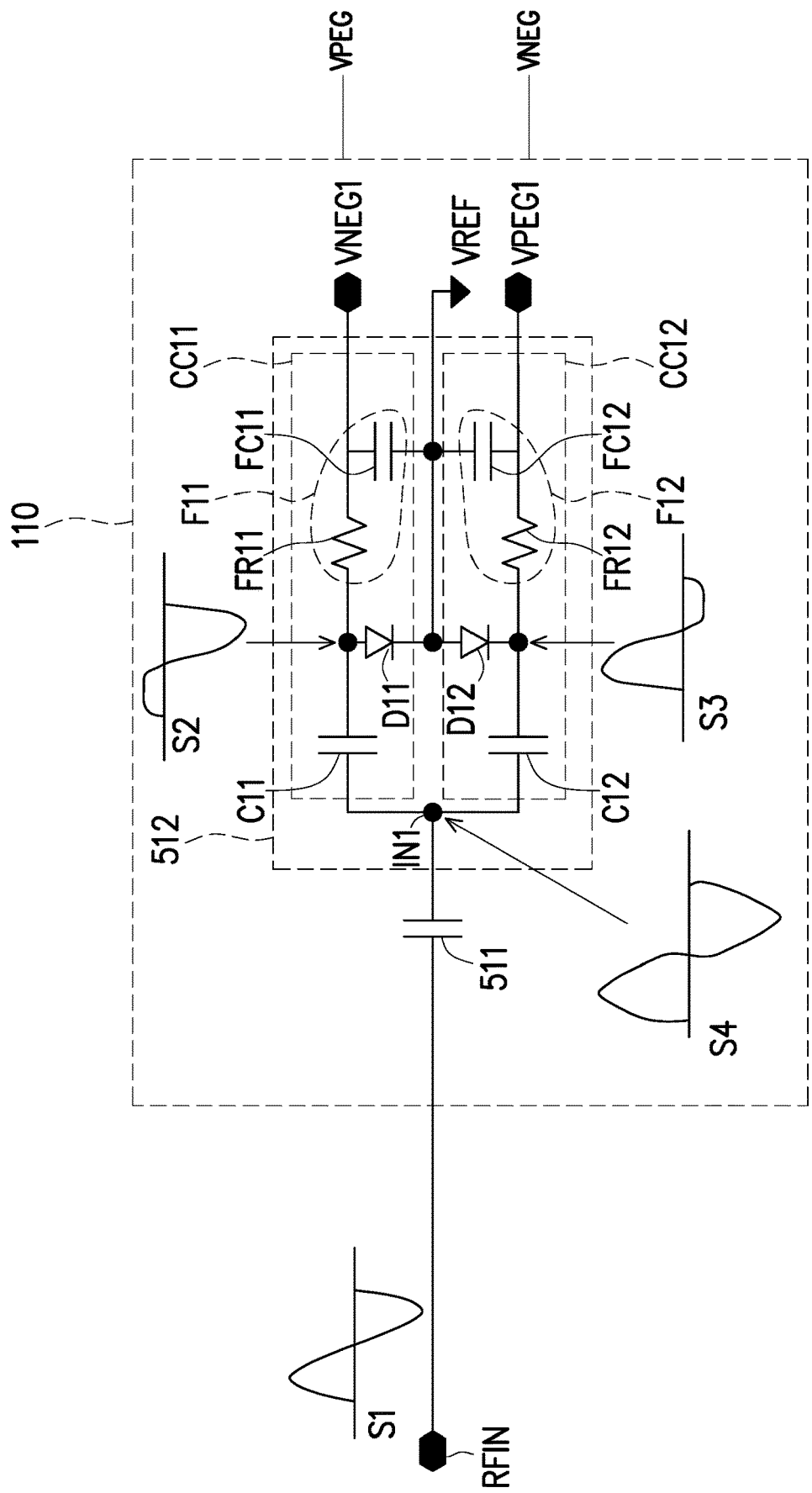
FIG. 5 is a schematic circuit diagram of a voltage generation and harmonic suppressor shown in FIG. 1 to FIG. 4 according to an embodiment of the disclosure.

FIG. 5 is a schematic circuit diagram of a voltage generation and harmonic suppressor 110 shown in FIG. 1 to FIG. 4 according to an embodiment of the disclosure. In the embodiment shown in FIG. 5, the voltage generation and harmonic suppressor 110 includes a DC blocking capacitor 511 and a voltage generation and harmonic suppression circuit 512. The DC blocking capacitor 511 may be configured to block the DC component in the RF signal S1. The voltage generation and harmonic suppression circuit 512 may be configured to receive the RF signal S1 and to suppress an even harmonic generated by the RF signal S1 in the voltage generation and harmonic suppression circuit 512. An input terminal IN1 of the voltage generation and harmonic suppressor 110 may be coupled to the input terminal of the voltage generation and harmonic suppressor 110 through the DC blocking capacitor 511. The voltage generation and harmonic suppression circuit 512 includes conversion circuits CC11 and CC12.

The conversion circuit CC11 is configured to convert the RF signal S1 into a DC voltage VNEG1. The conversion circuit CC11 includes a DC blocking capacitor C11, a rectifier circuit D11, and a filter circuit F11. A first terminal of the DC blocking capacitor C11 is coupled to the input terminal IN1 of the voltage generation and harmonic suppression circuit 512. The DC blocking capacitor C11 may be configured to block the DC component in the RF signal S1.

A first terminal of the rectifier circuit D11 is coupled to a second terminal of the DC blocking capacitor C11, and a second terminal is coupled to a reference voltage terminal. The reference voltage terminal may be configured to receive a reference voltage VREF. The level of the reference voltage VREF may be determined according to design requirements. For example, the reference voltage VREF may be a ground voltage or other fixed voltages. The rectifier circuit D11 may include a half-wave rectifier circuit for rectifying the RF signal S1 into a negative half-cycle signal S2. For example, the rectifier circuit D11 includes a diode, a first terminal (such as anode) of the diode is coupled to the first terminal of the rectifier circuit D11, and a second terminal (such as cathode) is coupled to the second terminal of the rectifier circuit D11.

A first terminal of the filter circuit F11 is coupled to the second terminal of the DC blocking capacitor C11, and a second terminal is coupled to a first output terminal of the voltage generation and harmonic suppression circuit 512. The filter circuit F11 may reduce the ripple in the negative half-cycle signal S2 to provide the DC voltage VNEG1. In some embodiments, the DC voltage VNEG1 has an AC component. The filter circuit F11 may include a resistor FR11 and a capacitor FC11. A first terminal of the resistor FR11 is coupled to the first terminal of the filter circuit F11, and a second terminal is coupled to the second terminal of the filter circuit F11. A first terminal of the capacitor FC11 is coupled to the second terminal of the resistor FR11, and a second terminal is coupled to the reference voltage terminal.

The conversion circuit CC12 is configured to convert the RF signal S1 into a DC voltage VPEG1. The conversion circuit CC12 includes a DC blocking capacitor C12, a rectifier circuit D12, and a filter circuit F12. The DC blocking capacitor C12 is disposed corresponding to the DC blocking capacitor C11, the rectifier circuit D12 is disposed corresponding to the rectifier circuit D11, and the filter circuit F12 is disposed corresponding to the filter circuit F11. In other words, the conversion circuits CC11 and CC12 have corresponding circuit structures.

A first terminal of the DC blocking capacitor C12 is coupled to the input terminal IN1 of the voltage generation and harmonic suppression circuit 512. The DC blocking capacitor C12 may be configured to block the DC component in the RF signal S1. In some embodiments, the DC blocking capacitor 511 and/or the DC blocking capacitors C11 and C12 may be selectively disposed.

A first terminal of the rectifier circuit D12 is coupled to the reference voltage terminal, and a second terminal is coupled to a second terminal of the DC blocking capacitor C12. The rectifier circuit D12 may include a half-wave rectifier circuit for rectifying the RF signal S1 into a positive half-cycle signal S3. For example, the rectifier circuit D12 includes a diode, a first terminal (such as anode) of the diode is coupled to the first terminal of the rectifier circuit D12, and a second terminal (such as cathode) is coupled to the second terminal of the rectifier circuit D12.

A first terminal of the filter circuit F12 is coupled to the second terminal of the DC blocking capacitor C12, and a second terminal is coupled to a second output terminal of the voltage generation and harmonic suppression circuit 512. The filter circuit F12 may reduce the ripple in the positive half-cycle signal S3 to provide the DC voltage VPEG1. In some embodiments, the DC voltage VPEG1 has an AC component. The filter circuit F12 may include a resistor FR12 and a capacitor FC12. A first terminal of the resistor FR12 is coupled to the first terminal of the filter circuit F12, and a second terminal is coupled to the second terminal of the filter circuit F12. A first terminal of the capacitor FC12 is coupled to the reference voltage terminal, and a second terminal is coupled to the second terminal of the resistor FR12.

According to design requirements, the DC voltage VPEG1 may be selectively used as the DC voltage VPEG shown in FIG. 1 to FIG. 4 and/or the DC voltage VNEG1 may be selectively used as the DC voltage VNEG shown in FIG. 1 to FIG. 4. For example, the second output terminal of the voltage generation and harmonic suppression circuit 512 may be coupled to the first output terminal of the voltage generation and harmonic suppressor 110, so as to output the DC voltage VPEG1 as the DC voltage VPEG. Alternatively, the second output terminal of the voltage generation and harmonic suppression circuit 512 may be floating, so as not to output the DC voltage VPEG1 as the DC voltage VPEG. Similarly, the first output terminal of the voltage generation and harmonic suppression circuit 512 may be coupled to the second output terminal of the voltage generation and harmonic suppressor 110, so as to output the DC voltage VNEG1 as the DC voltage VNEG. Alternatively, the first output terminal of the voltage generation and harmonic suppression circuit 512 may be floating, so as not to output the DC voltage VNEG1 as the DC voltage VNEG.

In the embodiment shown in FIG. 5, the signal S4 is formed at the input terminal IN1 of the voltage generation and harmonic suppression circuit 512 after the voltage generation and harmonic suppression circuit 512 performs a signal processing on the RF signal S1. The signal processing is that the voltage generation and harmonic suppression circuit 512 performs rectification on the RF signal S1 to generate the negative half-cycle signal S2 and the positive half-cycle signal S3. Furthermore, because the diodes in the rectifier circuits D11 and D12 are non-linear elements, the negative half-cycle signal S2 and the positive half-cycle signal S3 have an even harmonic and an odd harmonic. The negative half-cycle signal S2 and the positive half-cycle signal S3 may be fed back to the input terminal IN1, and superimposed on the input terminal IN1 to form the signal S4. The signal S4 is a periodic signal. Since the conversion circuits CC11 and CC12 have corresponding circuit structures, they may suppress the even harmonic in the signal S4 (that is, the conversion circuits CC11 and CC12 are configured to suppress the even harmonic generated by the RF signal S1 in the voltage generation and harmonic suppression circuit 512). However, the odd harmonic still remains in the signal S4. Referring to FIG. 1 to FIG. 5, the signal S4 may be further fed back to the RF circuit 120 through the input terminal of the voltage generation and harmonic suppressor 110, which affects the performance of the RF circuit 120.

Figure 6:
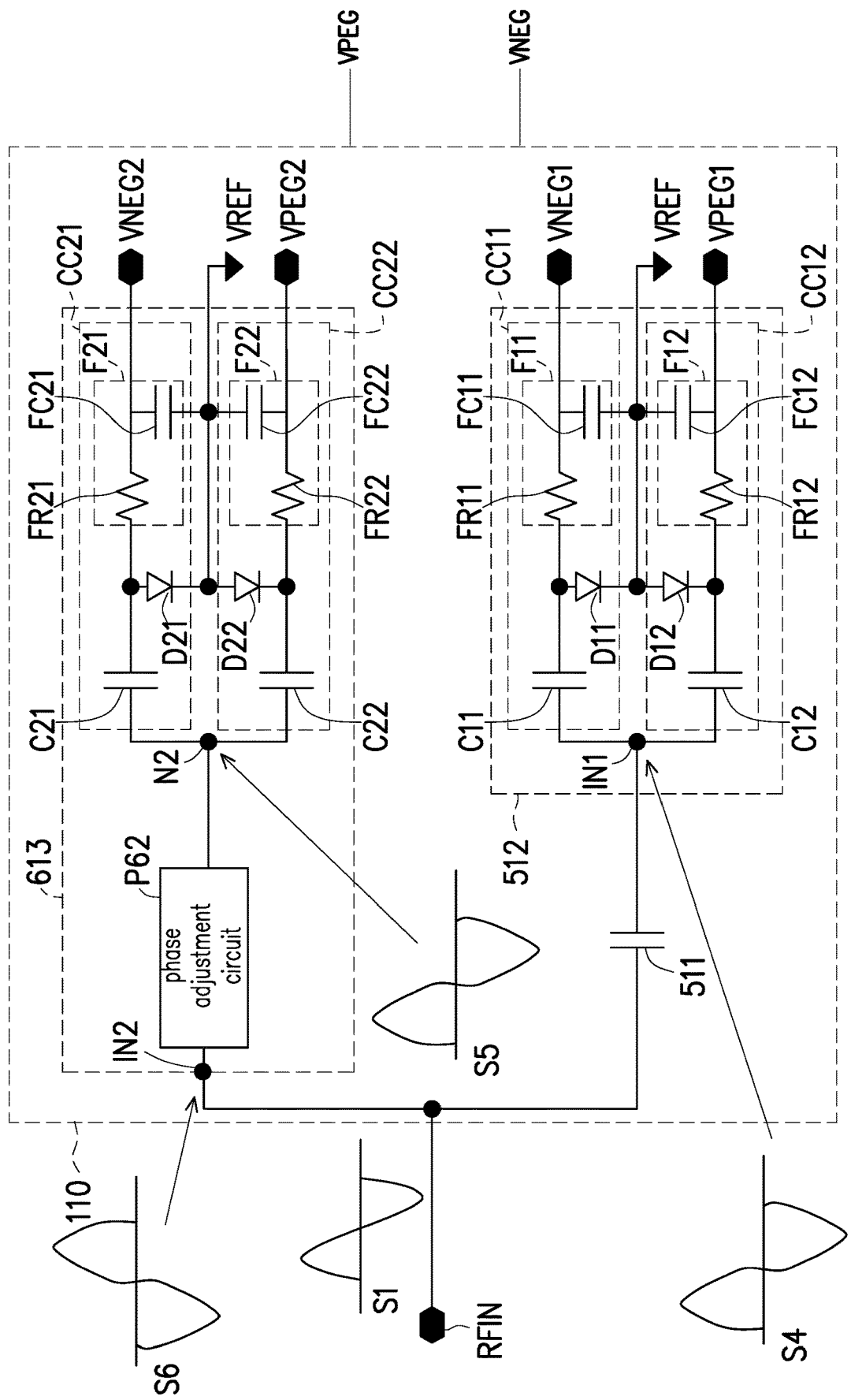
FIG. 6 is a schematic circuit diagram of a voltage generation and harmonic suppressor shown in FIG. 1 to FIG. 4 according to another embodiment of the disclosure.

FIG. 6 is a schematic circuit diagram of a voltage generation and harmonic suppressor 110 shown in FIG. 1 to FIG. 4 according to another embodiment of the disclosure. Compared with the voltage generation and harmonic suppressor 110 of FIG. 5, the voltage generation and harmonic suppressor 110 of FIG. 6 further includes a voltage generation and harmonic suppression circuit 613.

In the embodiment shown in FIG. 6, an input terminal IN2 of the voltage generation and harmonic suppression circuit 613 is coupled to the input terminal of the voltage generation and harmonic suppressor 110. The voltage generation and harmonic suppression circuit 613 may be configured for receiving the RF signal S1 and suppressing the odd harmonic generated by the RF signal S1 in the voltage generation and harmonic suppression circuit 512. The voltage generation and harmonic suppression circuit 613 includes conversion circuits CC21 and CC22 and a phase adjustment circuit P62. An input terminal of the conversion circuit CC21 is coupled to an input terminal of the conversion circuit CC22 to form a node N2. The phase adjustment circuit P62 is coupled between the input terminal IN2 of the voltage generation and harmonic suppression circuit 613 and the node N2 of the voltage generation and harmonic suppression circuit 613.

The conversion circuit CC21 is configured to convert the RF signal S1 into a DC voltage VNEG2. The conversion circuit CC21 includes a DC blocking capacitor C21, a rectifier circuit D21, and a filter circuit F21. A first terminal of the DC blocking capacitor C21 is coupled to the node N2. The DC blocking capacitor C21 may be configured to block the DC component in the RF signal S1.

A first terminal of the rectifier circuit D21 is coupled to a second terminal of the DC blocking capacitor C21, and a second terminal is coupled to the reference voltage terminal. The reference voltage terminal may be configured to receive the reference voltage VREF. The rectifier circuit D21 may include a half-wave rectifier circuit for rectifying the RF signal S1 into a negative half-cycle signal. For example, the rectifier circuit D21 includes a diode, a first terminal (such as anode) of the diode is coupled to the first terminal of the rectifier circuit D21, and a second terminal (such as cathode) is coupled to the second terminal of the rectifier circuit D21.

A first terminal of the filter circuit F21 is coupled to the second terminal of the DC blocking capacitor C21, and a second terminal is coupled to a first output terminal of the voltage generation and harmonic suppression circuit 613. The filter circuit F21 can reduce the ripple in the negative half-cycle signal to provide the DC voltage VNEG2. In some embodiments, the DC voltage VNEG2 has an AC component. The filter circuit F21 may include a resistor FR21 and a capacitor FC21. A first terminal of the resistor FR21 is coupled to the first terminal of the filter circuit F21, and a second terminal is coupled to the second terminal of the filter circuit F21. A first terminal of the capacitor FC21 is coupled to the second terminal of the resistor FR21, and a second terminal is coupled to the reference voltage terminal.

The conversion circuit CC22 is configured to convert the RF signal S1 into a DC voltage VPEG2. The conversion circuit CC22 includes a DC blocking capacitor C22, a rectifier circuit D22, and a filter circuit F22. The DC blocking capacitor C22 is disposed corresponding to the DC blocking capacitor C21, the rectifier circuit D22 is disposed corresponding to the rectifier circuit D21, and the filter circuit F22 is disposed corresponding to the filter circuit F21. In other words, the conversion circuits CC21 and CC22 have corresponding circuit structures. In addition, the circuit structures of the conversion circuits CC21 and CC22 correspond to the circuit structures of the conversion circuits CC11 and CC12.

A first terminal of the DC blocking capacitor C22 is coupled to the node N2. The DC blocking capacitor C22 may be configured to block the DC component in the RF signal S1. A first terminal of the rectifier circuit D22 is coupled to the reference voltage terminal, and a second terminal is coupled to a second terminal of the DC blocking capacitor C22. The rectifier circuit D22 may include a half-wave rectifier circuit for rectifying the RF signal S1 into a positive half-cycle signal. For example, the rectifier circuit D22 includes a diode, a first terminal (such as anode) of the diode is coupled to the first terminal of the rectifier circuit D22, and a second terminal (such as cathode) is coupled to the second terminal of the rectifier circuit D22.

A first terminal of the filter circuit F22 is coupled to the second terminal of the DC blocking capacitor C22, and a second terminal is coupled to a second output terminal of the voltage generation and harmonic suppression circuit 613. The filter circuit F22 may reduce the ripple in the positive half-cycle signal to provide the DC voltage VPEG2. In some embodiments, the DC voltage VPEG2 has an AC component. The filter circuit F22 may include a resistor FR22 and a capacitor FC22. A first terminal of the resistor FR22 is coupled to the first terminal of the filter circuit F22, and a second terminal is coupled to the second terminal of the filter circuit F22. A first terminal of the capacitor FC22 is coupled to the reference voltage terminal, and a second terminal is coupled to the second terminal of the resistor FR22.

According to design requirements, the DC voltages VPEG1 and VPEG2 may be selectively used as the DC voltage VPEG shown in FIG. 1 to FIG. 4 and/or the DC voltages VNEG1 and VNEG2 may be selectively used as the DC voltage VNEG shown in FIG. 1 to FIG. 4. For example, the second output terminal of the voltage generation and harmonic suppression circuit 512 and/or the second output terminal of the voltage generation and harmonic suppression circuit 613 may be coupled to the first output terminal of the voltage generation and harmonic suppressor 110, so as to output the DC voltage VPEG1 and/or VPEG2 as the DC voltage VPEG. Alternatively, the second output terminal of the voltage generation and harmonic suppression circuit 512 and/or the second output terminal of the voltage generation and harmonic suppression circuit 613 may be floating, so as not to output the DC voltage VPEG1 and/or VPEG2 as the DC voltage VPEG. Similarly, the first output terminal of the voltage generation and harmonic suppression circuit 512 and/or the first output terminal of the voltage generation and harmonic suppression circuit 613 may be coupled to the second output terminal of the voltage generation and harmonic suppressor 110, so as to output the DC voltage VNEG1 and/or VNEG2 as the DC voltage VNEG. Alternatively, the first output terminal of the voltage generation and harmonic suppression circuit 512 and/or the first output terminal of the voltage generation and harmonic suppression circuit 613 may be floating, so as not to output the DC voltage VNEG1 and/or VNEG2 as the DC voltage VNEG. In other words, at least one of the voltage generation and harmonic suppression circuit 512 and the voltage generation and harmonic suppression circuit 613 may be configured to output at least one DC voltage VPEG1, VPEG2, VNEG1, and/or VNEG2 related to the RF signal S1.

In the embodiment shown in FIG. 6, in addition to the signal S4 having the odd harmonic at the input terminal IN1 of the voltage generation and harmonic suppression circuit 512, a signal S5 may be formed at the node N2 of the voltage generation and harmonic suppression circuit 613 after the voltage generation and harmonic suppression circuit 613 performs a signal processing on the RF signal S1. The signal processing is that the voltage generation and harmonic suppression circuit 613 performs rectification on the RF signal S1 to generate a negative half-cycle signal and a positive half-cycle signal. Furthermore, because the circuit structures of the conversion circuits CC21 and CC22 correspond to the circuit structures of the conversion circuits CC11 and CC12, the negative half-cycle signal generated by the rectifier circuit D21 in the conversion circuit CC21 and the positive half-cycle signal generated by the rectifier circuit D22 in the conversion circuit CC22 may also be fed back to the node N2, and superimposed on the node N2 to form the signal S5. The signal S5 is a periodic signal. The conversion circuits CC21 and CC22 having corresponding circuit structures may be configured to suppress an even harmonic in the signal S5 (that is, the conversion circuits CC21 and CC22 are configured to suppress the even harmonic generated by the RF signal S1 in the voltage generation and harmonic suppression circuit 613). However, an odd harmonic still remains in the signal S5. Referring to FIG. 1 to FIG. 4 and FIG. 6, the signal S5 may be further fed back to the RF circuit 120 through the input terminal of the voltage generation and harmonic suppressor 110, which affects the performance of the RF circuit 120.

The phase adjustment circuit P62 may be configured to adjust a phase of the signal S5 to generate a signal S6. The odd harmonic remains in the signal S6. For example, the phase adjustment circuit P62 may adjust the phase of the signal S5 to be different from a phase of the signal S4 by 180 degrees to generate the signal S6. That is, a phase of the signal S6 and the phase of the signal S4 substantially differ by 180 degrees. In this way, when the signal S4 and the signal S6 are fed back toward the RF circuit 120, the odd harmonic in the signal S4 and the odd harmonic in the signal S6 may cancel each other out at the input terminal of the voltage generation and harmonic suppressor 110, thereby reducing the influence of the harmonic on the RF circuit 120. In some embodiments, a phase difference between the signal S4 and the signal S6 may be determined according to design requirements. In other embodiments, the phase adjustment circuit P62 may include a T-type network, a π-type network, or a transmission line. The T-type network or the π-type network may be composed of at least two of resistors, capacitors, and inductors.

Figure 7:
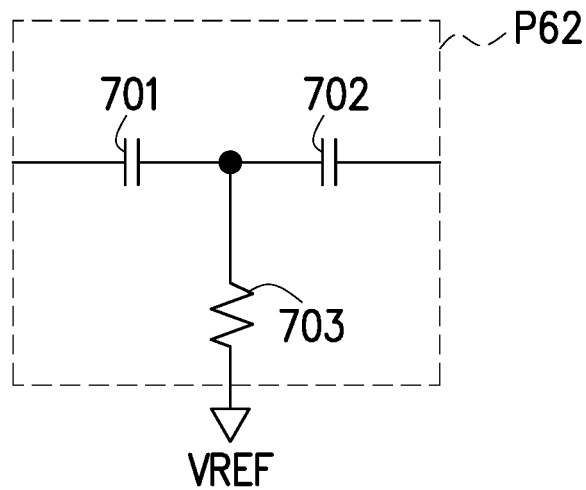
FIG. 7 is a schematic circuit diagram of a phase adjustment circuit shown in FIG. 6 according to an embodiment of the disclosure.

FIG. 7 is a schematic circuit diagram of a phase adjustment circuit P62 shown in FIG. 6 according to an embodiment of the disclosure. In the embodiment shown in FIG. 7, the phase adjustment circuit P62 includes a T-type network. The T-type network includes capacitors 701 and 702, and a resistor 703. A first terminal of the capacitor 701 is coupled to the input terminal IN2 of the voltage generation and harmonic suppression circuit 613. A first terminal of the resistor 703 is coupled to a second terminal of the capacitor 701, and a second terminal is coupled to the reference voltage terminal. The reference voltage terminal is configured to receive the reference voltage VREF. A first terminal of the capacitor 702 is coupled to the second terminal of the capacitor 701, and a second terminal is coupled to the node N2 of the voltage generation and harmonic suppression circuit 613.

Figure 8:
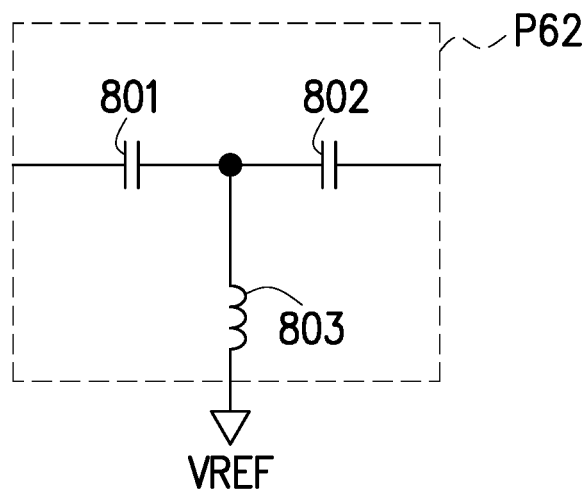
FIG. 8 is a schematic circuit diagram of a phase adjustment circuit shown in FIG. 6 according to another embodiment of the disclosure.

FIG. 8 is a schematic circuit diagram of a phase adjustment circuit P62 shown in FIG. 6 according to another embodiment of the disclosure. In the embodiment shown in FIG. 8, the phase adjustment circuit P62 includes a T-type network. The T-type network includes capacitors 801 and 802, and an inductor 803. A first terminal of the capacitor 801 is coupled to the input terminal IN2 of the voltage generation and harmonic suppression circuit 613. A first terminal of the inductor 803 is coupled to a second terminal of the capacitor 801, and a second terminal is coupled to the reference voltage terminal. The reference voltage terminal is configured to receive the reference voltage VREF. A first terminal of the capacitor 802 is coupled to the second terminal of the capacitor 801, and a second terminal is coupled to the node N2 of the voltage generation and harmonic suppression circuit 613.

Figure 9:
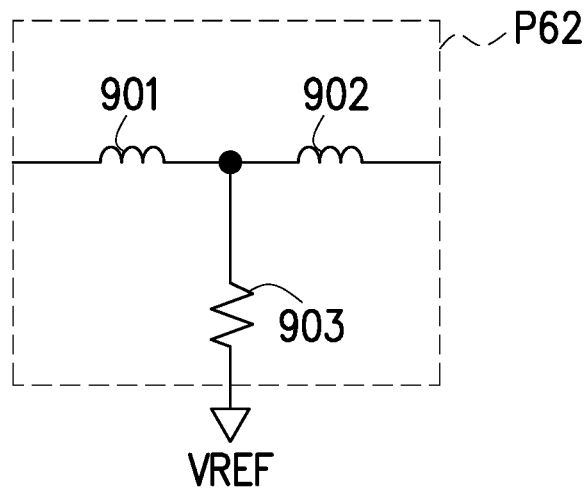
FIG. 9 is a schematic circuit diagram of a phase adjustment circuit shown in FIG. 6 according to yet another embodiment of the disclosure.

FIG. 9 is a schematic circuit diagram of a phase adjustment circuit P62 shown in FIG. 6 according to yet another embodiment of the disclosure. In the embodiment shown in FIG. 9, the phase adjustment circuit P62 includes a T-type network. The T-type network includes inductors 901 and 902, and a resistor 903. A first terminal of the inductor 901 is coupled to the input terminal IN2 of the voltage generation and harmonic suppression circuit 613. A first terminal of the resistor 903 is coupled to a second terminal of the inductor 901, and a second terminal is coupled to the reference voltage terminal. The reference voltage terminal is configured to receive the reference voltage VREF. A first terminal of the inductor 902 is coupled to the second terminal of the inductor 901, and a second terminal is coupled to the node N2 of the voltage generation and harmonic suppression circuit 613.

Figure 10:
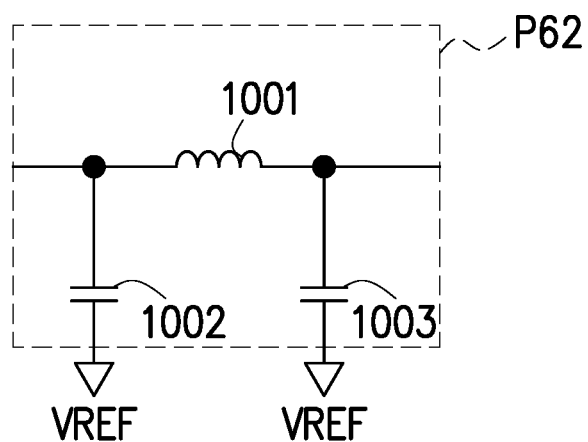
FIG. 10 is a schematic circuit diagram of a phase adjustment circuit shown in FIG. 6 according to yet another embodiment of the disclosure.

FIG. 10 is a schematic circuit diagram of a phase adjustment circuit P62 shown in FIG. 6 according to yet another embodiment of the disclosure. In the embodiment shown in FIG. 10, the phase adjustment circuit P62 includes a π-type network. The π-type network includes an inductor 1001, and capacitors 1002 and 1003. A first terminal of the inductor 1001 is coupled to the input terminal IN2 of the voltage generation and harmonic suppression circuit 613, and a second terminal is coupled to the node N2 of the voltage generation and harmonic suppression circuit 613. A first terminal of the capacitor 1002 is coupled to the first terminal of the inductor 1001, and a second terminal is coupled to the reference voltage terminal. A first terminal of the capacitor 1003 is coupled to the second terminal of the inductor 1001, and a second terminal is coupled to the reference voltage terminal. The reference voltage terminal is configured to receive the reference voltage VREF.

In summary, the RF device and the voltage generation and harmonic suppressor thereof according to the embodiments of the disclosure may generate the at least one DC voltage according to the RF signal. In this way, the level of the at least one DC voltage may vary with the power of the RF signal, so that a non-linear component is not easily derived from the RF signal or the RF circuit in the RF device has improved performance. In addition, by designing the circuit structure of the voltage generation and harmonic suppressor, the harmonic generated by the RF signal in the voltage generation and harmonic suppressor may also be suppressed to reduce the influence of the harmonic on the RF circuit.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A radio frequency (RF) device, comprising:
a voltage generation and harmonic suppressor configured to receive a RF signal to output at least one direct current (DC) voltage related to the RF signal, and configured to suppress a harmonic generated by the RF signal in the voltage generation and harmonic suppressor; and
a RF circuit configured to receive the RF signal, and configured to perform an operation according to the at least one DC voltage,
wherein the RF circuit further comprises:
a first voltage selection circuit configured to generate one of a high-level power supply voltage of a logic circuit and a low-level power supply voltage of the logic circuit according to a first DC voltage and a first base voltage;
wherein a level of the first DC voltage varies with power of the RF signal, and the first base voltage is independent of voltage variations of the first DC voltage.

2. The RF device according to claim 1, wherein
the at least one DC voltage comprises the first DC voltage and a second DC voltage;
the RF circuit comprises a RF switch, and the operation performed by the RF circuit according to the at least one DC voltage comprises performing an off operation on the RF switch;
wherein the RF switch comprises an N-metal oxide semiconductor (NMOS) transistor having a triple-well structure or a P-metal oxide semiconductor (PMOS) transistor having a triple-well structure; the first DC voltage and the second DC voltage apply a reverse bias voltage to a PN junction of the NMOS transistor to set the NMOS transistor to an off state; or the first DC voltage and the second DC voltage apply a reverse bias voltage to a PN junction of the PMOS transistor to set the PMOS transistor to an off state.

3. The RF device according to claim 1, wherein
the at least one DC voltage comprises the first DC voltage;
the RF circuit further comprises:
the logic circuit configured to receive a control signal and output an output signal; and
a RF element configured to receive the output signal, wherein the output signal is configured to control the RF element;
wherein the operation performed by the RF circuit according to the at least one DC voltage comprises performing a power supply operation on the logic circuit, and one of the high-level power supply voltage and the low-level power supply voltage of the logic circuit is related to the first DC voltage.

4. The RF device according to claim 3, wherein the first DC voltage is one of the high-level power supply voltage and the low-level power supply voltage of the logic circuit.

5. The RF device according to claim 1, wherein
the RF circuit further comprises:
a first controller configured to determine the higher one of the first DC voltage and the first base voltage to control the first voltage selection circuit to generate the high-level power supply voltage accordingly.

6. A radio frequency (RF) device, comprising: a voltage generation and harmonic suppressor configured to receive a RF signal to output at least one direct current (DC) voltage related to the RF signal, and configured to suppress a harmonic generated by the RF signal in the voltage generation and harmonic suppressor; and a RF circuit configured to receive the RF signal, and configured to perform an operation according to the at least one DC voltage, wherein the at least one DC voltage comprises a first DC voltage and a second DC voltage; wherein the RF circuit includes: a logic circuit, configured to receive a control signal and output an output signal; and a RF element configured to receive the output signal, wherein the output signal is configured to control the RF element; wherein the operation performed by the RF circuit according to the at least one DC voltage comprises performing a power supply operation on the logic circuit, and one of a high-level power supply voltage and a low-level power supply voltage of the logic circuit is related to the first DC voltage, wherein the first DC voltage is one of a high-level power supply voltage of the logic circuit and a low-level power supply voltage of the logic circuit, wherein one of the high-level power supply voltage of the logic circuit and the low-level power supply voltage of the logic circuit is related to the second DC voltage.

7. The RF device according to claim 6, wherein the second DC voltage is one of the high-level power supply voltage and the low-level power supply voltage of the logic circuit.

8. The RF device according to claim 6, wherein the RF circuit further comprises:
  a second voltage selection circuit configured to generate one of the high-level power supply voltage and the low-level power supply voltage according to the second DC voltage and a second base voltage;
  wherein a level of the second DC voltage varies with power of the RF signal, and the second base voltage is independent of voltage variations of the second DC voltage.

9. The RF device according to claim 8, wherein the RF circuit further comprises:
  a second controller configured to determine the lower one of the second DC voltage and the second base voltage to control the second voltage selection circuit to generate the low-level power supply voltage accordingly.

10. A voltage generation and harmonic suppressor, comprising:
  a first voltage generation and harmonic suppression circuit configured to receive a radio frequency (RF) signal, and configured to suppress a first even harmonic generated by the RF signal in the first voltage generation and harmonic suppression circuit; and
  a second voltage generation and harmonic suppression circuit configured to receive the RF signal, and configured to suppress a first odd harmonic generated by the RF signal in the first voltage generation and harmonic suppression circuit;
  wherein at least one of the first voltage generation and harmonic suppression circuit and the second voltage generation and harmonic suppression circuit is configured to output at least one direct current (DC) voltage related to the RF signal.

11. The voltage generation and harmonic suppressor according to claim 10, wherein a first signal is formed at an input terminal of the first voltage generation and harmonic suppression circuit after the first voltage generation and harmonic suppression circuit performs a first signal processing on the RF signal, and the first signal has the first odd harmonic.

12. The voltage generation and harmonic suppressor according to claim 11, wherein the first signal processing is that the first voltage generation and harmonic suppression circuit performs rectification on the RF signal to generate a first negative half-cycle signal and a first positive half-cycle signal, and the first negative half-cycle signal and the first positive half-cycle signal are configured to form the first signal.

13. The voltage generation and harmonic suppressor according to claim 11, wherein a second signal is formed at a node of the second voltage generation and harmonic suppression circuit after the second voltage generation and harmonic suppression circuit performs a second signal processing on the RF signal, and the second signal has a second odd harmonic.

14. The voltage generation and harmonic suppressor according to claim 13, wherein the second signal processing is that the second voltage generation and harmonic suppression circuit performs rectification on the RF signal to generate a second negative half-cycle signal and a second positive half-cycle signal, and the second negative half-cycle signal and the second positive half-cycle signal are configured to form the second signal.

15. The voltage generation and harmonic suppressor according to claim 13, wherein the second voltage generation and harmonic suppression circuit comprises a phase adjustment circuit coupled between an input terminal of the second voltage generation and harmonic suppression circuit and the node of the second voltage generation and harmonic suppression circuit, and configured to adjust a phase of the second signal to generate a third signal.

16. The voltage generation and harmonic suppressor according to claim 15, wherein a phase of the third signal and a phase of the first signal are substantially different from each other by 180 degrees.

17. The voltage generation and harmonic suppressor according to claim 15, wherein the phase adjustment circuit comprises a T-type network, a $\pi$-type network or a transmission line.

18. The voltage generation and harmonic suppressor according to claim 10, wherein
  the at least one DC voltage comprises a first DC voltage and a second DC voltage;
  the first voltage generation and harmonic suppression circuit comprises:
    a first conversion circuit configured to convert the RF signal into the first DC voltage; and
    a second conversion circuit configured to convert the RF signal into the second DC voltage;
    wherein the first conversion circuit and the second conversion circuit have corresponding circuit structures to suppress the first even harmonic generated by the RF signal in the first voltage generation and harmonic suppression circuit.

19. The voltage generation and harmonic suppressor according to claim 18, wherein
  the at least one DC voltage further comprises a third DC voltage and a fourth DC voltage;
  the second voltage generation and harmonic suppression circuit comprises:
    a third conversion circuit configured to convert the RF signal into the third DC voltage; and
    a fourth conversion circuit configured to convert the RF signal into the fourth DC voltage;
    wherein the third conversion circuit and the fourth conversion circuit have corresponding circuit structures to suppress a second even harmonic generated by the RF signal in the second voltage generation and harmonic suppression circuit.

\* \* \* \* \*